US011652399B2

United States Patent
Zeng et al.

(10) Patent No.: US 11,652,399 B2
(45) Date of Patent: May 16, 2023

(54) MILLER CLAMP PROTECTION CIRCUIT, DRIVING CIRCUIT, DRIVING CHIP AND INTELLIGENT IGBT MODULE

(71) Applicant: Trex Technologies, Guangdong (CN)

(72) Inventors: Zhuo Zeng, Guangdong (CN); Min Jennifer Fang, Guangdong (CN)

(73) Assignee: TREX TECHNOLOGIES, Guangdong (CN)

( * ) Notice: Subject to any disclaimer, the term of this patent is extended or adjusted under 35 U.S.C. 154(b) by 0 days.

(21) Appl. No.: 17/401,684

(22) Filed: Aug. 13, 2021

(65) Prior Publication Data
US 2022/0060014 A1 Feb. 24, 2022

(30) Foreign Application Priority Data
Aug. 19, 2020 (CN) .......................... 202010841532.3

(51) Int. Cl.
*H02M 1/32* (2007.01)
*H02M 1/38* (2007.01)
*H03K 17/0812* (2006.01)
*H02H 9/02* (2006.01)
*H03K 19/0175* (2006.01)
*H03K 5/01* (2006.01)
*H03K 5/00* (2006.01)

(52) U.S. Cl.
CPC ............... *H02M 1/32* (2013.01); *H02H 9/02* (2013.01); *H02M 1/38* (2013.01); *H03K 17/0812* (2013.01); *H03K 19/017509* (2013.01); *H03K 5/01* (2013.01); *H03K 2005/00013* (2013.01)

(58) Field of Classification Search
CPC ................... H02M 1/38; H03K 17/081–08128
See application file for complete search history.

(56) References Cited

U.S. PATENT DOCUMENTS

| | | | |
|---|---|---|---|
| 2016/0277012 A1* | 9/2016 | Abesingha | H03K 5/1534 |
| 2017/0338812 A1* | 11/2017 | Hokazono | H03K 17/18 |
| 2021/0242864 A1* | 8/2021 | Okada | H03K 17/08128 |
| 2021/0293874 A1* | 9/2021 | Kwon | H02H 1/0007 |

* cited by examiner

*Primary Examiner* — Jared Fureman
*Assistant Examiner* — Christopher J Clark
(74) *Attorney, Agent, or Firm* — Muncy, Geissler, Olds & Lowe, P.C.

(57) ABSTRACT

Disclosed are a Miller Clamp protection circuit, a driving circuit, a driving chip and an intelligent IGBT module, which are connected to a device to be driven. The Miller Clamp protection circuit comprises a main driving circuit configured to provide a driving signal; a Miller switch configured to reduce a voltage glitch; a Miller switch control circuit configured to automatically control an on and off of the Miller switch according to an intermediate signal of the main driving circuit. The main driving circuit is connected to a power supply, the Miller switch control circuit, one end of the Miller switch and the device to be driven, and another end of the Miller switch is grounded.

9 Claims, 3 Drawing Sheets

MILLER CLAMP PROTECTION CIRCUIT, DRIVING CIRCUIT, DRIVING CHIP AND INTELLIGENT IGBT MODULE

CROSS-REFERENCES TO RELATED APPLICATIONS

This application claims priority to Chinese Patent Application No. 202010841532.3, filed on Aug. 19, 2020, the content of all of which is incorporated herein by reference.

FIELD OF THE DISCLOSURE

The present disclosure relates to the Insulated Gate Bipolar Transistor (IGBT) driving field, in particular to a Miller Clamp protection circuit, a driving circuit, a driving chip and an intelligent IGBT module.

BACKGROUND

Insulated Gate Bipolar Transistor (IGBT) plays an important role in power semiconductors due to a high current and high voltage driving capabilities. Most industrial applications use three-phase inverters to drive IGBT with high-voltage and high-current. For gate driving chips in a high power device, such as a half-bridge driving chip, a low-side IGBT may generate a voltage glitch after being turned off due to dv/dt exists in working, which may cause the IGBT to be on by mistake. Thus, the high-side and low-side may be turned on at the same time, causing unnecessary loss, more seriously, module may heat up and burn the device.

Therefore, the existing technology needs to be improved.

BRIEF SUMMARY OF THE DISCLOSURE

In view of the above-mentioned shortcomings of the prior art, a purpose of the present disclosure is to provide a Miller Clamp protection circuit, a driving circuit, a driving chip and an intelligent IGBT module.

The present disclosure provides a Miller Clamp protection circuit connected to a device to be driven, including:

a main driving circuit configured to provide a driving signal;

a Miller switch configured to reduce a voltage glitch;

a Miller switch control circuit configured to automatically control a on and off of the Miller switch according to an intermediate signal from the main driving circuit;

the main driving circuit is connected to a power supply, the Miller switch control circuit, one end of the Miller switch and the device to be driven, and another end of the Miller switch is grounded.

The main driving circuit includes:

a level shifter configured to level shift;

a delay matching circuit configured to delay matching;

an output driving circuit configured to output a driving signal;

a current limiting circuit configured to limit an output current of an output signal;

the level shifter, the delay matching circuit, the output driving circuit, and the current limiting circuit are connected in sequence, the level shifter is also connected to the Miller switch control circuit.

The current limiting circuit includes a first resistor, one end of the first resistor is connected to an output terminal of the output driving circuit, another end of the first resistor is connected to the Miller switch control circuit, a Miller circuit, and the device to be driven.

Further, the Miller Clamp protection circuit includes a reference circuit configured to provide a reference voltage, the reference circuit is connected to the Miller switch control circuit.

The Miller switch control circuit includes:

a comparison circuit configured to compare an input circuit with the reference voltage;

a switch control circuit configured to receive a voltage from the level shifter and a voltage from the comparison circuit and output a control voltage of the Miller switch according to the voltage from the level shifter and the voltage from the comparison circuit.

The comparison circuit includes a comparator, a non-inverting input terminal of the comparator is connected to the reference circuit, an inverting input terminal of the comparator is connected to the main driving circuit, one end of the Miller switch and the device to be driven, an output terminal of the comparator is connected to the switch control circuit.

The switch control circuit includes a latch, an S pin of the latch is connected to the output terminal of the comparator, an R pin of the latch is connected to the main driving circuit, and a Q pin of the latch is connected to a gate of the Miller switch.

Another aspect of the present disclosure relates to a driving circuit including the Miller Clamp protection circuit described above.

Another aspect of the present disclosure relates to a driving chip comprises a chip body in which the Miller Clamp protection circuit described above is packaged; a LO pin is arranged on the chip body, through which the Miller switch and the main driving circuit are connected to the device to be driven.

Another aspect of the present disclosure relates to an intelligent IGBT module comprises a module body, in which the Miller Clamp protection circuit or the driving circuit described above is arranged.

Compared with the prior art, the Miller Clamp protection circuit, the driving the driving circuit, and the intelligent IGBT module provided in the present disclosure are connected to the device to be driven. The Miller Clamp protection circuit includes a main driving circuit configured to provide a driving signal; a Miller switch configured to reduce a voltage glitch; a Miller switch control circuit configured to automatically control an on and off of the Miller switch according to an intermediate signal of the main driving circuit. The main driving circuit is connected to a power supply, the Miller switch control circuit, one end of the Miller switch and the device to be driven, and another end of the Miller switch is grounded. The present disclosure drives the device to be driven by the main driving circuit, and controls the Miller switch control circuit to turn on or off the Miler switch by the intermediate signal of the main driving circuit, so as to realize the purpose of automatically reducing the voltage glitch.

LABEL NUMBER IN THE FIGURES

Figure 1:
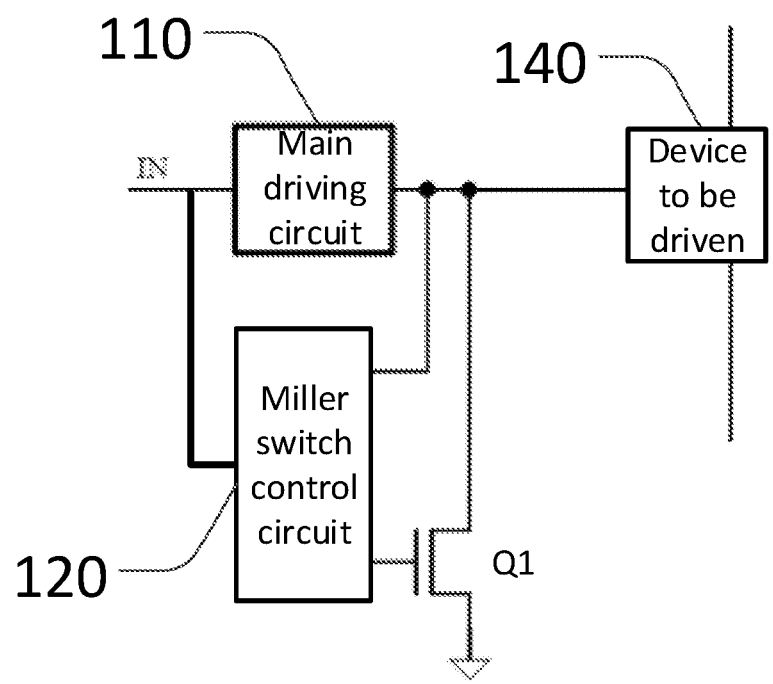
FIG. 1 illustrates a schematic functional diagram of a Miller Clamp protection circuit of the present disclosure.

Intelligent IGBT module 10; low-side driving chip 100; first high-side driving chip 201; second high-side driving chip 202; third high-side driving chip 203; first high-side IGBT 301; second high-side IGBT 302; third high-side IGBT 303; first low-side IGBT 401; second low-side IGBT 402; third low-side IGBT 403; main driving circuit 110; Miller switch control circuit 120; reference circuit 130; level shifter 111; delay matching circuit 112; output driving circuit 113; current limiting circuit 114; first resistor R1; comparison circuit 121; switch control circuit 122; comparator U1; latch SR; Miller switch Q1.

DETAILED DESCRIPTION OF EMBODIMENTS

The present disclosure provides a Miller Clamp protection circuit, a driving circuit, a driving chip and an intelligent IGBT module, which are connected to a device to be driven. The device to be driven is driven by the main driving circuit, and the Miller switch control circuit is controlled by an intermediate signal of the main driving circuit to turn the Miller switch on or off, so as to realize a purpose of automatically reducing the voltage glitch.

Embodiments disclosed in the present disclosure are intended to describe the technical concept of the present disclosure, the technical problem to be solved, the technical features form the technical solution, and the technical effects brought by the present disclosure. It should be noted that the explanation of these embodiments does not limit the protection scope of the present disclosure. In addition, a combination of the technical features disclosed in the embodiments is allowed as long as the features do not conflict with each other.

In order to facilitate the understanding of the embodiments of the present application, relevant elements involved in the embodiments of the present application are introduced hereinafter.

IGBT: The full English name is Insulated Gate Bipolar Transistor, which is a composite fully controlled voltage-driven power semiconductor device composed of BJT (Bipolar Junction Transistor) and MOS (Metal-Oxide-Semiconductor, i.e. insulated gate field effect transistor). The IGBT has advantages of both a high input impedance of MOSFET (Metal-Oxide-Semiconductor Field-Effect Transistor) and a low forward voltage drop of GTR (Giant Transistor). For GTR, the forward voltage drop is small, the current-carrying density is high, but the driving current is large; for MOSFET, the driving power is small, the switching speed is fast, but the forward voltage drop is large and the current-carrying density is small. IGBT combines the advantages of both devices, i.e. low driving power and small forward voltage drop, which is very suitable to be used in converter systems with a DC (Direct Current) voltage equal to or larger than 600V, such as AC (Alternating Current) motor, frequency converter, switching power supply, lighting circuit, traction drive and so on.

Level shifter: Convert the I/O (Input and Output) voltage in the circuit to enable communication between devices with different I/O voltages.

Delay matching circuit: Delay matching is a measure used to indicate a matching accuracy of the internal transmission delay between channels. If a signal is applied to the input terminals of two channels at the same time, the delay output from the two channels is a value of the delay matching. The smaller the value of the delay matching, the better the performance that the gate driver may achieve.

dv/dt: dv/dt represents a change rate of voltage. In high voltage frequency conversion, because the output voltage is a series of rectangular pulses with equal amplitude and unequal width, the larger the pulse amplitude and the shorter the rising time or falling time, the more serious the dv/dt will become. The value of dv/dt has great effect on the performance and reliability of the frequency converter: 1) When dv/dt increases, an impulse current may impact and burn out the frequency converter. 2) The greater the dv/dt, the greater the damage to the insulating material, which makes the insulating material easy to age and shortens the service life of the frequency converter. 3) When the dv/dt is large, some electronic switching devices may be easily turned on by mistake.

The inventors have found that, in half bridge IGBT driving field, when the IGBT is off, the low-side IGBT may generate voltage glitch after being off due to the existence of dv/dt, resulting in low-side IGBT to be on by mistake. So that both the high-side IGBT and the low-side IGBT are turned on, this may cause unnecessary loss or damage the device. Therefore, in order to effectively control the gate voltage of the IGBT and prevent an excessively high voltage glitch from appearing, the circuit needs to be redesigned to reduce a value of the voltage glitch to prevent the IGBT from being turned on by mistake.

In view of the above-described problem, the present disclosure designs a novel internal circuit of a driving chip. The internal circuit is divided into a main driving circuit 110, a Miller switch control circuit 120 and a Miller switch Q1. A device to be driven 140 is driven by the main driving circuit 110, and the Miller switch Q1 is controlled to be on or off by the Miller switch control circuit 120 according to an intermediate signal of the main driving circuit 110, to achieve the purpose of automatically reduce voltage glitch.

Figure 2:
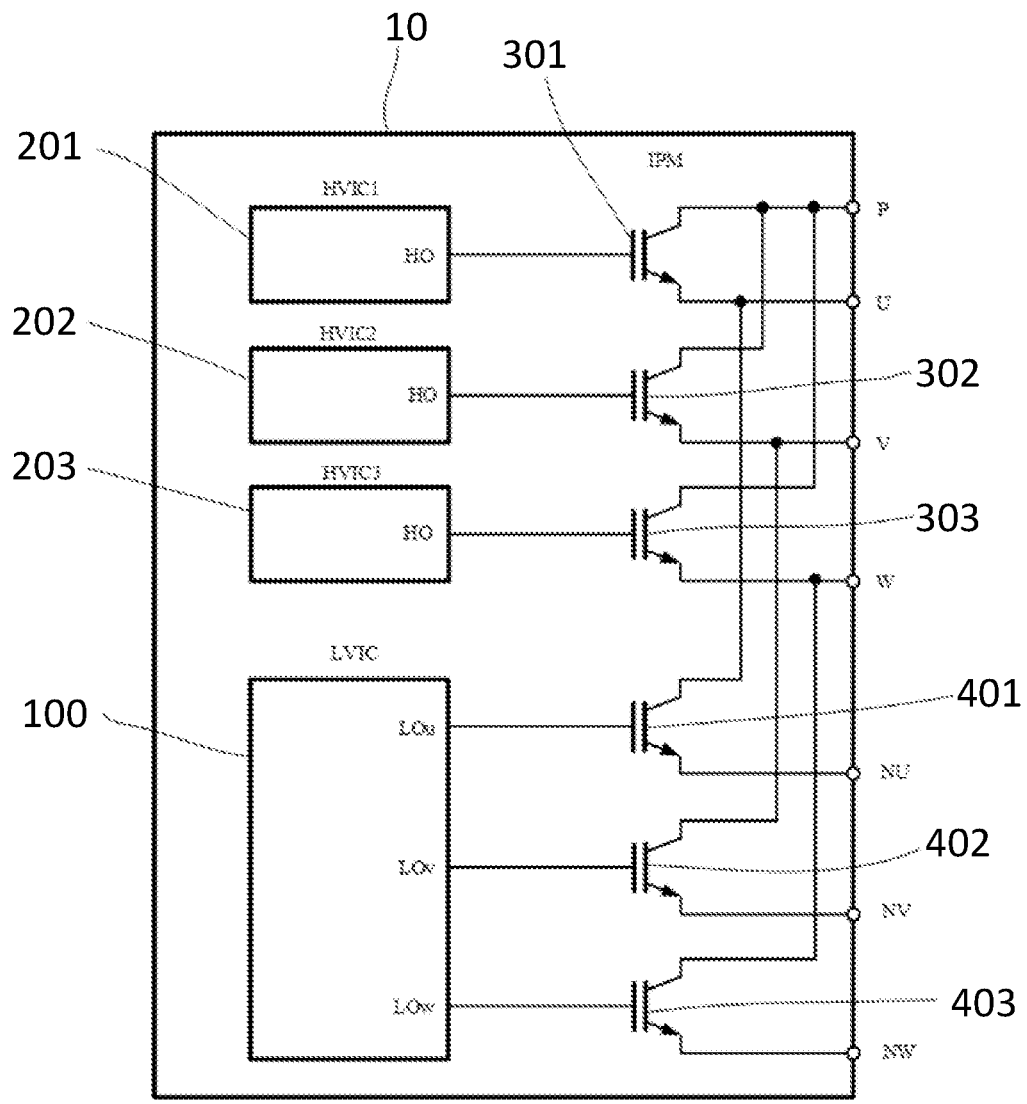
FIG. 2 illustrates a schematic functional diagram of an intelligent IGBT module of the present disclosure.

For example, the embodiment may as shown in FIG. 2. In this scenario, as shown in FIG. 2, an IGBT driving chip is integrated with an IGBT to form an intelligent IGBT module 10 (IPM, Intelligent Power Module1). An internal circuit of the IGBT driving chip is redesigned in the present embodiment so that a driving pin of the IGBT driving chip is incorporated with a discharge pin of the Miller switch Q1 and is connected directly to a gate of the IGBT, to obtain a Miller Clamp protection circuit shown in FIG. 1. The Miller Clamp protection circuit which comprises a main driving circuit 110 configured to provide a driving signal; a Miller switch Q1 configured to reduce a voltage glitch; and a Miller switch control circuit 120 configured to automatically control a on and off of the Miller switch Q1 according to an intermediate signal from the main driving circuit 110 is connected to the device to be drive 140 and a power supply. The main driving circuit 110 is connected to the power supply, the Miller switch control circuit 120, on end of the Miller switch Q1 and the device to be driven 140, another end of the Miller switch Q1 is grounded.

In the present embodiment, an input terminal of the main driving circuit 110 is input an input voltage (IN in the FIG. 1), the main driving circuit 110 processes the input voltage and outputs a driving signal to the device to be driven 140 and the Miller switch Q1, the device to be driven 140 is turned on after receiving the driving signal. The main driving circuit 110 also outputs an intermediate signal to the Miller switch control circuit 120. When the device to be driven 140 is turned on, the Miller switch control circuit 120 controls the Miller switch Q1 to turn off according to the intermediate signal; when the device to be driven is turned off, the Miller switch control circuit controls the Miller switch Q1 to turn on according to the intermediate signal to discharge the dv/dt. Thus the voltage glitch generated by dv/dt is discharged, a voltage value of the voltage glitch is reduced, which prevents the device to be driven 140 from being turned on by mistake. In particular, in the present embodiment, the device to be driven 140 is an IGBT, and the Miller switch Q1 is a MOS transistor.

Figure 3:
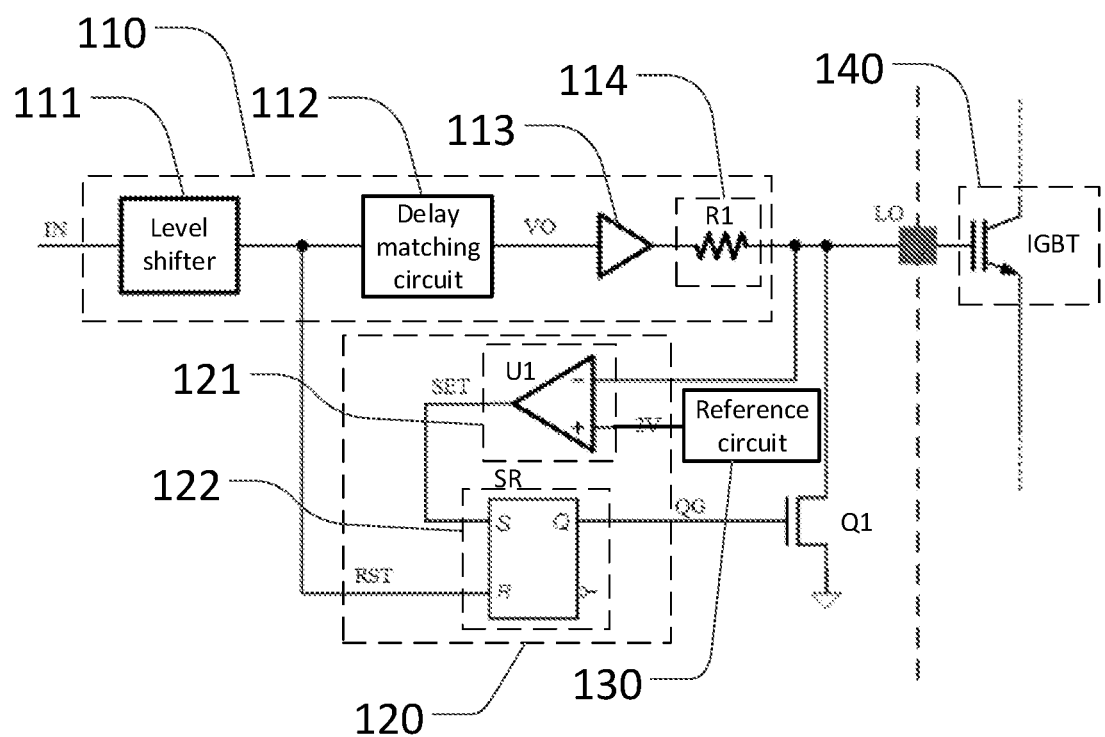
FIG. 3 illustrates a circuit diagram of a Miller Clamp circuit protection circuit of the present disclosure.

Referring to FIG. 3, the main driving circuit 110 comprises a level shifter 111 configured to level shift; a delay matching circuit 112 configured to delay matching; an output driving circuit 113 configured to output a driving signal; a current limiting circuit 114 configured to limit an output current of an output signal. The level shifter 111, the delay matching circuit 112, the output driving circuit 113, and the current limiting circuit 114 are connected in sequence, the level shifter 111 is also connected to the Miller switch control circuit 120.

In the present embodiment, an input voltage is provided by the power supply. The input voltage is input through the level shifter 111, and is transferred to a corresponding output voltage (i.e. intermediate signal) by level shift to be output to the delay matching circuit 112 and the Miller switch control circuit 120. The output voltage (intermediate signal) is delay matched by the delay matching circuit 112, and output to the output driving circuit 113. Then a driving voltage is isolated and output from the output driving circuit 113, and is limited by the current limiting circuit 114 to be an appropriate driving voltage to be output to the device to be driven 140 (i.e. IGBT). The gate of the IGBT is turned on, and starts to work. On the other hand, the Miller switch control circuit 120 receives the output voltage (i.e. intermediate signal) output from the level shifter 111, and outputs a corresponding control voltage according to the driving voltage output from the current limiting circuit 114 to control a on and off of the Miller switch Q1.

Referring to FIG. 3 together, the current limiting circuit 114 comprises a first resistor R1, one end of the first resistor R1 is connected to an output terminal of the output driving circuit 113, another end of the first resistor R1 is connected to the Miller switch control circuit 120, a Miller circuit, and the device to be driven 140. In the present embodiment, the first resistor R1 limits a current to a preset value, and the preset value may be set according to a resistance value of the first resistor R1, which is not limited here.

Further, referring to FIG. 3, the Miller Clamp protection circuit further comprises a reference circuit 130 configured to provide a reference voltage, the reference circuit 130 is connected to the Miller switch control circuit 120. In the present embodiment, the reference circuit 130 provides a reference voltage for the Miller switch control circuit 120.

Referring to FIG. 3, the Miller switch control circuit 120 comprises a comparison circuit 121 configured to compare an input circuit with the reference voltage, a switch control circuit 122 configured to receive a voltage from the level shifter and a voltage from the comparison circuit and output a control voltage of the Miller switch according to the same.

In the present embodiment, the comparison circuit 121 comprises a comparator U1, a non-inverting input terminal of the comparator U1 is connected to the reference circuit 130, an inverting input terminal of the comparator U1 is connected to the main driving circuit 110, one end of the Miller switch Q1 and the device to be driven 140, an output terminal of the comparator U1 is connected to the switch control circuit 122. The switch control circuit 122 comprises a latch SR, an S pin of the latch SR is connected to the output terminal of the comparator U1, an R pin of the latch SR is connected to the main driving circuit 110, and a Q pin of the latch SR is connected to a gate of the Miller switch Q1.

In the present embodiment, the reference voltage is input from the non-inverting input terminal of the comparator U1, the driving voltage output from the current limiting circuit 114 is input to the inverting input terminal of the comparator U1. When the driving voltage is higher than the reference voltage, the comparator U1 outputs a low level; when the driving voltage is lower than the reference voltage, the comparator U1 outputs a high level. The latch SR is an SR latch (Set/Reset latch).

Referring to FIG. 3, when the IGBT is turned off, the input voltage of the level shifter 111 is low level, and then an intermediate signal with low level is output from the level shifter 111. The R pin of the latch SR is connected to a low level, and the inverting input terminal of the comparator U1 is connected to a low level. In this case, the comparator U1 outputs a high level to the S pin of the latch SR, thus the Q pin of the latch SR outputs a high level, which turns the Miller switch Q1 on, and discharge a voltage glitch between the current limiting circuit 114 and the IGBT to the ground, and the voltage glitch is reduced to be lower than an turn-on voltage of the IGBT, which prevents the IGBT from being turned on by mistake.

When the IGBT is turned on again, the input voltage of the level shifter 111 becomes a high level, and then an intermediate signal with high level is output from the level shifter 111. The R pin of the latch SR is connected to a high level, and the inverting input terminal of the comparator U1 is connected to a high level. At this time, the voltage of the inverting input terminal of the comparator U1 is higher than the voltage of the non-inverting input terminal of the comparator U1, therefore the comparator U1 outputs a low level to the S pin of the latch SR, the Q pin of the latch SR outputs a low level to control the Miller switch Q1 to be turned off and the IGBT to be turned on. When the IGBT is turned on, the Miller switch Q1 is turned off to prevent the Miller switch Q1 from reducing a gate voltage of the IGBT, and the Miller switch Q1 is turned on only when the IGBT is turned off to achieve the purpose of reducing the voltage glitch.

In the present embodiment, the reference voltage is set as 2V.

The present disclosure further provides a driving circuit which comprises a Miller Clamp protection circuit described above. Optionally, multiple Miller Clamp protection circuits may be arranged, the exact number may be decided according to needs. For example, generally three high-side driving circuits and one low-side driving circuit may be arranged in the present IPM, and three Miller Clamp protection circuits described above may be provided in the low-side driving circuit accordingly. Since the Miller Clamp protection circuit has been described in detail above, it will not be described in detail here.

The present disclosure further provides a driving chip comprising a chip main body (low-side driving chip 100) in which the Miller Clamp protection circuit described above is packaged. A LO pin is arranged on the chip main body, through which the Miller switch Q1 and the main driving circuit 110 are connected to the device to be driven 140. Optionally, multiple Miller Clamp protection circuits may be arranged, the exact number may be decided according to needs. As shown in FIG. 2, the driving chip in the present embodiment is the low-side driving circuit (LVIC) in the figure. Three Miller Clamp protection circuits may be arranged in the low-side driving circuit (LVIC), the Miller Clamp protection circuits may be connected to a Lou (phase U low-side output) pin, a LOv (phase V low-side output) pin and a Low (phase W low-side output) pin respectively and connected to the gate of the IGBT through the LOu pin, the LOv pin and the LOw pin, to achieve Miller Clamp protecting. Since the Miller Clamp protection circuit has been described in detail above, it will not be described in detail here.

Further, based on the Miller Clamp protection circuit, the driving circuit and the driving chip, as shown in FIG. 2, the present disclosure further provides an intelligent IGBT module 10 comprising a module body which is provided with the Miller Clamp protection circuit described above, the driving circuit described above or the driving chip described above. The intelligent IGBT module 10 further comprises a first high-side driving chip 201, a second high-side driving chip 202, a third high-side driving chip 203, a first high-side IGBT 301, a second high-side IGBT 302, a third high-side IGBT 303, a first low-side IGBT 401, a second low-side IGBT 402 and a third low-side IGBT 403. The first high-side driving chip 201 is a phase U high-side driving chip, the second high-side driving chip 202 is a phase V high-side driving chip, the third high-side driving chip 203 is a phase W high-side driving chip, the first high-side IGBT 301 is a phase U high-side IGBT, the second high-side IGBT 302 is a phase V high-side IGBT, the third high-side IGBT 303 is a phase W high-side IGBT, the first low-side IGBT 401 is a phase U low-side IGBT, the second low-side IGBT 402 is a phase V low-side IGBT and the third low-side IGBT 403 is a phase W low-side IGBT.

The first high-side driving chip 201, the second high-side driving chip 202, the third high-side driving chip 203, and the above-mentioned driving chip are all connected to the power supply. The first high-side driving chip 201 is connected to the gate of the first high-side IGBT 301, the second high-side driving chip 202 is connected to the gate of the second high-side IGBT 302, and the third high-side driving chip 203 is connected to the gate of the third high-side IGBT 303. The driving chip described above is connected to the first low-side IGBT 401, the second low-side IGBT 402, and the third low-side IGBT 403 respectively. The collectors and emitters of the first high-side IGBT 301, the second high-side IGBT 302, the third high-side IGBT 303, the first low-side IGBT 401, the second low-side IGBT 402 and third low-side IGBT 403 are all connected to external devices to achieve the corresponding circuit function. The working scene and working principle of the IGBT is the prior art, and will not be described in detail here.

In summary, the present disclosure provides a Miller Clamp protection circuit, a driving circuit, a driving chip and an intelligent IGBT module which are connected to a device to be driven. The Miller Clamp protection circuit comprises a main driving circuit configured to provide a driving signal; a Miller switch configured to reduce a voltage glitch; a Miller switch control circuit configured to automatically control an on and off of the Miller switch according to an intermediate signal of the main driving circuit. The main driving circuit is connected to a power supply, the Miller switch control circuit, one end of the Miller switch and the device to be driven, and another end of the Miller switch is grounded. The present disclosure drives the device to be driven by the main driving circuit, and controls the Miller switch control circuit to turn on or off the Miler switch by the intermediate signal of the main driving circuit, so as to realize the purpose of automatically reducing the voltage glitch.

It can be understood that for those skilled in the art, equivalent substitutions or changes can be made according to the technical solution of the present disclosure and its inventive concept, and all these changes or substitutions shall fall within the protection scope of the appended claims of the present disclosure.

What is claimed is:

1. A Miller clamp protection circuit being connected to a device to be driven, and comprising:

a main driving circuit configured to provide a driving signal and output an intermediate signal, wherein an input voltage provided by a power supply is transferred to the intermediate signal;

a Miller switch configured to reduce a voltage glitch;

a Miller switch control circuit receiving the intermediate signal from the main driving circuit and configured to automatically control a on and off of the Miller switch according to the intermediate signal from the main driving circuit;

the main driving circuit is connected to the power supply, the Miller switch control circuit, one end of the Miller switch and the device to be driven, and another end of the Miller switch is grounded;

wherein when the device to be driven is turned on, the Miller switch control circuit controls the Miller switch to turn off according to the intermediate signal; when the device to be driven is turned off, the Miller switch control circuit controls the Miller switch to turn on according to the intermediate signal to discharge the voltage glitch.

2. The Miller clamp protection circuit according to claim 1, wherein the main driving circuit comprises:

a level shifter configured to level shift;

a delay matching circuit configured to delay matching;

an output driving circuit configured to output a driving signal;

a current limiting circuit configured to limit an output current of an output signal;

the level shifter, the delay matching circuit, the output driving circuit, and the current limiting circuit are connected in sequence, the level shifter is also connected to the Miller switch control circuit.

3. The Miller clamp protection circuit according to claim 2, wherein the current limiting circuit comprises a first resistor, one end of the first resistor is connected to an output terminal of the output driving circuit, another end of the first resistor is connected to the Miller switch control circuit, a Miller circuit, and the device to be driven.

4. The Miller clamp protection circuit according to claim 2, wherein further comprising a reference circuit configured to provide a reference voltage, the reference circuit is connected to the Miller switch control circuit.

5. The Miller clamp protection circuit according to claim 4, wherein the Miller switch control circuit comprises:

a comparison circuit configured to compare an input circuit with the reference voltage;

a switch control circuit configured to receive a voltage from the level shifter and a voltage from the comparison circuit and output a control voltage of the Miller switch according to the voltage from the level shifter and the voltage from the comparison circuit.

6. The Miller clamp protection circuit according to claim 5, wherein the comparison circuit comprises a comparator, a non-inverting input terminal of the comparator is connected to the reference circuit, an inverting input terminal of the comparator is connected to the main driving circuit, one end of the Miller switch and the device to be driven, an output terminal of the comparator is connected to the switch control circuit.

7. The Miller clamp protection circuit according to claim 6, wherein the switch control circuit comprises a latch, an S pin of the latch is connected to the output terminal of the comparator, an R pin of the latch is connected to the main driving circuit, and a Q pin of the latch is connected to a gate of the Miller switch.

8. A driving circuit, wherein comprising the Miller clamp protection circuit according to claim 1.

9. A driving chip, wherein comprising a chip body in which the Miller clamp protection circuit according to claim 1 is packaged; a LO pin is arranged on the chip body, through which the Miller switch and the main driving circuit are connected to the device to be driven.

* * * * *